United States Patent [19]

Yamazaki et al.

[11] Patent Number: 5,256,881
[45] Date of Patent: Oct. 26, 1993

[54] MASK AND CHARGED PARTICLE BEAM EXPOSURE METHOD USING THE MASK

[75] Inventors: Satoru Yamazaki; Hiroshi Yasuda; Kiichi Sakamoto, all of Kanagawa, Japan

[73] Assignee: Fujitsu Limited, Kanagawa, Japan

[21] Appl. No.: 896,715

[22] Filed: Jun. 10, 1992

[30] Foreign Application Priority Data

Jun. 12, 1991 [JP] Japan .................. 3-139858

[51] Int. Cl.[5] ...................................... H01J 37/302
[52] U.S. Cl. ........................... 250/492.23; 250/505.1
[58] Field of Search ............. 250/492.2, 492.23, 505.1

[56] References Cited

U.S. PATENT DOCUMENTS 4,914,304  4/1990  Koyama .................... 250/492.2
5,036,209  7/1991  Kataoka et al. .......... 250/492.2

FOREIGN PATENT DOCUMENTS 0364929   4/1990  European Pat. Off. .
0421695A3 4/1991  European Pat. Off. .
55-26620  2/1980  Japan ..................... 250/492.23

Primary Examiner—Jack I. Berman
Attorney, Agent, or Firm—Nikaido, Marmelstein, Murray & Oram

[57] ABSTRACT

A transmission mask is used when exposing patterns by a charged particle beam which passes therethrough. The transmission mask includes a plate, and a plurality of rectangular blocks formed on a surface of the plate and having an area approximately equal to a cross sectional area of the charged particle beam irradiated thereon, where the blocks include a first block in which at least one transmission hole is provided and a second block in which no transmission hole is provided. The transmission of the first block is partly irradiated by the charged particle beam when varying the size of the exposing pattern. A single second block is provided immediately adjacent to at least two first blocks, so that an irradiating position of the charged particle beam can be varied with respect to both the two first blocks from the single second block.

22 Claims, 10 Drawing Sheets

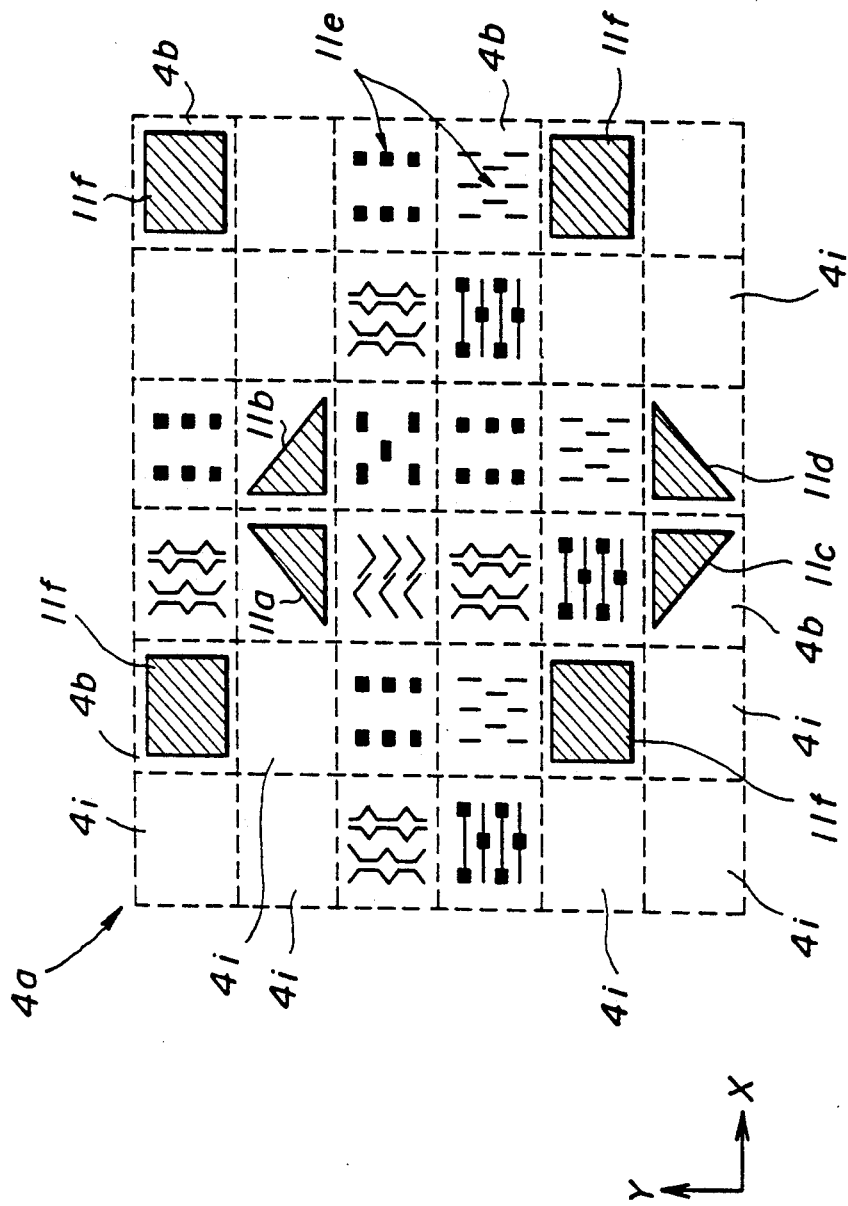

MASK AND CHARGED PARTICLE BEAM EXPOSURE METHOD USING THE MASK

BACKGROUND OF THE INVENTION

The present invention generally relates to masks and charged particle beam exposure methods using the masks, and more particularly to a mask having transmission hole which is partially irradiated by a charged particle beam when exposing variable patterns corresponding to elements of a circuit pattern of an integrated circuit, and to a charged particle beam exposure method which uses such a mask for the charged particle beam exposure.

The photolithography technique was popularly used to form fine patterns. But as the integration density of integrated circuit increased, charged particle beam exposure methods using an electron beam, an ion beam and the like or, an exposure method using an X-ray have been developed to form even finer patterns.

According to the electron beam exposure method which uses the electron beam, it is possible to form fine patterns of 1 μm or less because the spot of the electron beam can be reduced to several Å. However, because the electron beam exposure method draws the pattern, the spot of the electron beam must be reduced as the pattern size is reduced, and the exposure time becomes considerably long. The block exposure method was developed to overcome this problem of long exposure time.

The block exposure method uses a mask having a plurality of grouped regions, and each grouped region includes a plurality of blocks. Each block includes a plurality of holes which correspond to the patterns which frequently appear in the circuit pattern such as the integrated circuit (IC). The charged particle beam is irradiated on a selected one of the blocks.

FIG. 1 shows an essential part of an example of a conventional exposure apparatus for carrying out the conventional block exposure method. An electron beam output from an electron gun 1 is formed into a beam B1 having a rectangular cross section as it passes through a rectangular transmission hole 2. The beam B1 is deflected towards a specified transmission hole of a transmission mask 4 by deflection electrodes 3. The transmission mask 4 includes a plate with a plurality of grouped regions 4a as shown in FIG. 2A, and each grouped region 4a is made up of a plurality of blocks 4b.

As shown in FIG. 2B, each block 4b within the grouped region 4a of the plate includes a plurality of transmission holes 5 having shapes corresponding to elements which form the circuit pattern such as the IC. The block 4b may include only one transmission hole corresponding to a single pattern which is used for exposing variable shapes or, transmission holes corresponding to alignment patterns. Each block 4b is exposed during one exposure by the beam B1.

The deflection electrodes 3 electrostatically deflect the beam B1 to expose one selected block 4b within one grouped region 4a. But when selecting other blocks 4b within other grouped regions 4a, the transmission mask 4 must be moved mechanically by mask moving means Ax and Ay. The mask moving means Ax moves the transmission mask 4 in the direction of the X-axis, and the mask moving means Ay moves the transmission mask 4 in the direction of the Y-axis.

A beam B2 which is formed by passing the beam B1 through the transmission hole 5 of the selected block 4b is projected on a wafer 8 via a reduction lens 6 and an objective lens 7. The beam B2 is projected onto a predetermined position on the wafer 8 by an electrostatic deflector 9 and an electromagnetic deflector 10.

In order to effectively reduce the number of exposures and improve the throughput using this block exposure method, it is conceivable to make the area of the block 4b which becomes the exposure repeating unit as large as possible. But in this case, it also becomes necessary to increase the cross section of the electron beam. If the cross section of the electron beam is increased, the charge density of the electron beam decreases, and it becomes necessary to increase the irradiation time of each beam exposure. As a result, there is a limit to improving the throughput by increasing the area of the block 4b.

On the other hand, it is also conceivable to increase the area of the transmission mask 4 itself, so as to increase the number of blocks 4b which can be arranged on the transmission mask 4. But in this case, the number of times the transmission mask 4 must be moved mechanically by the mask moving means Ax and Ay increases. As a result, the throughput does not improve notably, and in addition, it becomes necessary to improve the function of deflecting the electron beam.

In view of the above, an improved exposure method was previously proposed in a U.S. Pat. No. 5,036,209. This proposed method uses the transmission mask 4 having the blocks 4b grouped within the respective grouped regions 4a as shown in FIG. 2A. In addition, the grouped regions 4a and the blocks 4b within each grouped region 4a are respectively arranged so that the holes 5 and the blocks 4b which are time-sequentially used for the exposure are located close to each other and in such a manner that the time required to move the transmission mask 4 mechanically and the time required to deflect the electron beam are minimized.

However, this proposed method is effective only when repeatedly drawing basic patterns. This proposed method is not effective when drawing non-repeating patterns by passing the beam B1 having the rectangular cross section through a part of the transmission hole in the transmission mask 4 for forming variable shapes, as will be described hereinafter.

FIGS. 3A through 3D are diagrams for explaining a method of exposing a desired pattern corresponding to the circuit pattern of the IC, by irradiating the beam B1 having the rectangular cross section over a transmission hole 11 which is used to form variable shapes. The shape of the exposed pattern is varied by controlling the irradiating position of the beam B1 relative to the transmission hole 11. For example, a triangular hole formed in one block 4b is used as the transmission hole 11. The cross section of the beam B1 is varied depending on the overlap of the beam B1 and the transmission hole 11.

In the case shown in FIG. 3A where the beam B1 overlaps a part of the triangular transmission hole 11, a shaped beam B2 having a small triangular cross section is obtained as shown in FIG. 3B. On the other hand, if the beam B1 overlaps the entire triangular transmission hole 11 as shown in FIG. 3C, a shaped beam B2 having a large triangular cross section is obtained as shown in FIG. 3D. However, in the case shown in FIG. 3A, the beam B1 overlaps both the block 4b1 in which the transmission hole 11 is provided and the block 4b2 which is adjacent to the block 4b1. For this reason, no transmission hole can be provided within the adjacent block 4b2 so as to prevent an unwanted pattern from being formed when the beam B1 overlaps the two mutually adjacent blocks 4b1 and 4b2.

Therefore, with respect to one transmission hole 11 within one block 4b which is used to form variable shapes, it becomes necessary to provide at least one adjacent block 4b in which no transmission hole is provided. In addition, depending on the shape of the transmission hole 11 which is used to form the variable shapes and depending on the kind of overlap of the beam B1 relative to the transmission hole 11, it may be necessary to provide more than one block 4b in which no transmission hole may be provided with respect to one block 4b in which the transmission hole 11 for forming the variable shape is provided. In other words, the number of blocks 4b in which no transmission hole may be provided, that is, wasted area, increases. As a result, there is a problem in that the efficiency with which the transmission holes are arranged in the transmission mask 4 deteriorates. Furthermore, if the efficiency with which the transmission holes are arranged in the transmission mask 4 deteriorates, there are also problems in that the time required to move the transmission mask 4 mechanically and the time required to deflect the electron beam increase.

SUMMARY OF THE INVENTION

Accordingly, it is a general object of the present invention to provide a novel and useful mask and a charged particle beam exposure method using the mask, in which the problems described above are eliminated.

Another and more specific object of the present invention is to provide a transmission mask adapted for use in exposing patterns by a charged particle beam which passes therethrough, comprising a plate, and a plurality of rectangular blocks formed on a surface of the plate and having an area approximately equal to a cross sectional area of the charged particle beam irradiated thereon, where the blocks include a first block in which at least one transmission hole is provided and a second block in which no transmission hole is provided, the transmission hole of the first block is partly irradiated by the charged particle beam when varying the size of the exposing pattern, and a single second block is provided immediately adjacent to at least two first blocks, so that an irradiating position of the charged particle beam can be varied with respect to both the two first blocks from the single second block. According to the transmission mask of the present invention, it is possible to minimize the area in which the provision of the transmission hole is prohibited, and improve the efficiency with which the transmission holes are arranged on the transmission mask. In addition, it is unnecessary to provide one second block for each first block.

Still another object of the present invention is to provide a charged particle beam exposure method which exposes patterns on an exposing surface using a transmission mask which includes a plurality of blocks including a first block in which at least one transmission hole is provided and a second block in which no transmission hole is provided, where the charged particle beam exposure method comprises the steps of (a) shaping a charged particle beam into a first beam having a rectangular cross section by a shaping means, (b) arranging the transmission mask between the shaping means and the exposing surface so that the rectangular cross section of the first beam irradiated on the transmission mask is approximately equal to an area of one block, (c) irradiating the first beam on the transmission mask with an overlap between two predetermined first and second blocks which are immediately adjacent to each other to partly irradiate a transmission hole of the predetermined first block by the first beam when varying the size of the exposing pattern, where the predetermined second block is provided immediately adjacent to at least two first blocks including the predetermined first block, so that an irradiating position of the first beam can be varied with respect to both the two first blocks from the predetermined second block, and (d) irradiating the exposing surface by a second beam which is shaped when the first beam passes through the transmission mask. According to the charged particle beam exposure method of the present invention, it is possible to reduce the number of times and the distance the transmission mask must be moved during the exposure. As a result, the exposure time as a whole can be reduced, thereby enabling an efficient charged particle beam exposure.

Other objects and further features of the present invention will be apparent from the following detailed description when read in conjunction with the accompanying drawings.

BRIEF DESCRIPTION OF THE DRAWINGS

FIG. 10 is a plan view showing an essential part of a sixth embodiment of the transmission mask according to the present invention.

DESCRIPTION OF THE PREFERRED EMBODIMENTS

Figure 1:
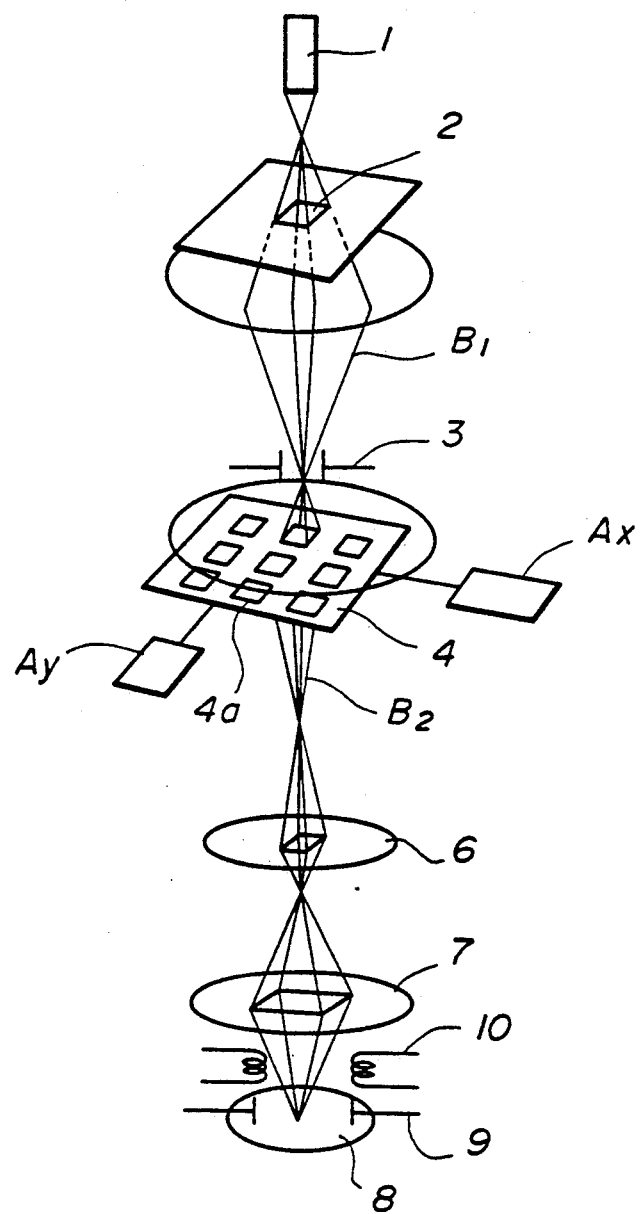
FIG. 1 is a perspective view showing an essential part of an example of a conventional exposure apparatus for carrying out a conventional block exposure method.
Figure 2A:
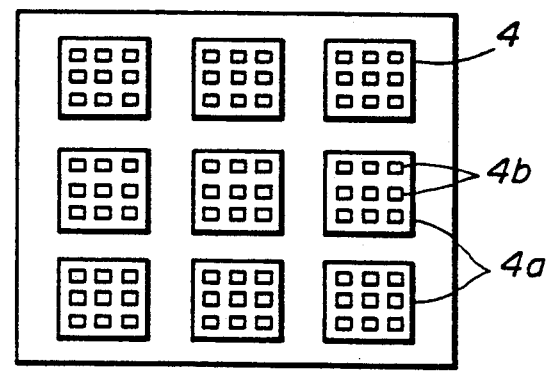
FIGS. 2A and 2B respectively are plan views showing a transmission mask and a grouped region of the transmission mask.
Figure 2B:
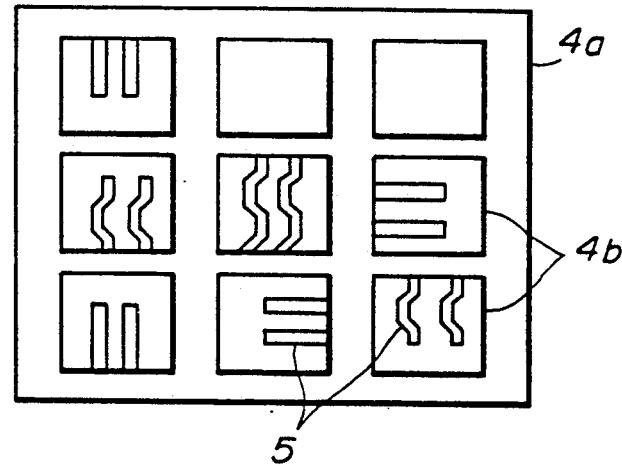
Figure 3C:
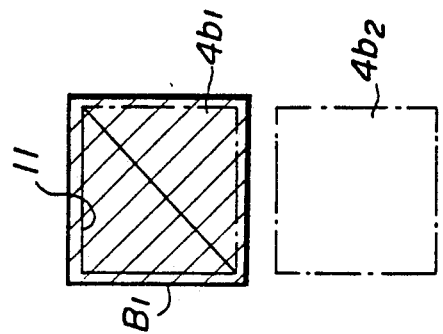
FIGS. 3A through 3D are are diagrams for explaining a method of exposing a desired pattern corresponding to a circuit pattern by irradiating a beam having a rectangular cross section over a transmission hole which is used to form variable shapes.
Figure 3D:
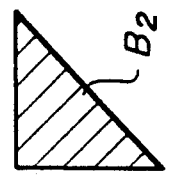
Figure 3A:
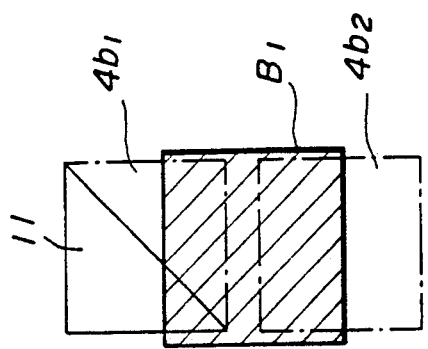
Figure 3B:

First, a description will be given of the operating principle of the present invention, by referring to FIG. 4. A transmission mask used in the present invention has a plurality of blocks 4b respectively including a transmission hole 11 for forming a variable shape corresponding to the element of the circuit pattern of the IC. This transmission mask is arranged between the rectangular transmission hole 2 which is used to form a charged particle beam having a rectangular cross section (hereinafter simply referred to as a rectangular beam B1) and an exposing surface which corresponds to the surface of the wafer 8 shown in FIG. 1, and the irradiating position of the rectangular beam B1 is controlled relative to the selected transmission hole 11 so as to form a desired shaped beam B2. The shaped beam B2 is the charged particle beam which is obtained after passing the rectangular beam B1 through the transmission hole 11.

The present invention defines the positional relationship of the transmission hole 11 and a prohibited block 4i in which the arrangement of the transmission hole is prohibited. In other words, when moving the rectangular beam B1 in X-Y directions on an X-Y plane so as to vary the irradiating position of the rectangular beam B1 relative to the transmission hole 11, a moving direction in which the cross sectional area of the shaped beam B2 gradually increases will be defined as a "gradually increasing direction". The transmission hole 11 is always arranged relative to the prohibited block 4i so that the transmission hole 11 is located on the gradually increasing side relative to the prohibited block 4i.

Figure 4:
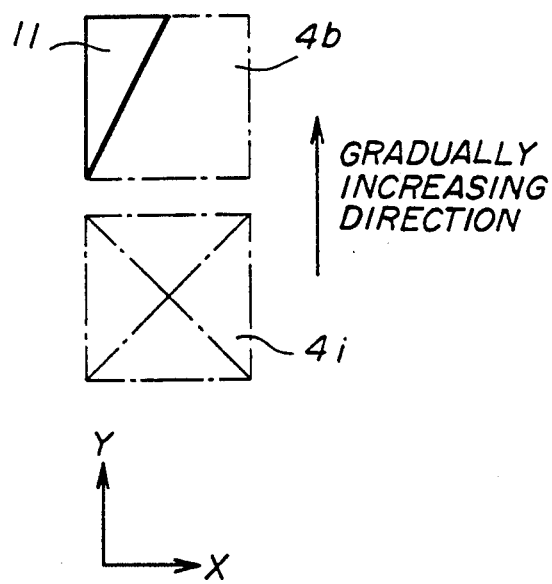
FIG. 4 is a plan view for explaining the operating principle of the present invention.

Accordingly, a transmission hole 11 having the +Y direction as its gradually increasing direction is arranged on the +Y direction side of a prohibited block 4i as shown in FIG. 4. A transmission hole 11 having the −Y direction as its gradually increasing direction may be arranged on the −Y direction side of a prohibited block 4i. Similarly, a transmission hole 11 having the +X direction as its gradually increasing direction may be arranged on the +X direction side of a prohibited block 4i, and a transmission hole 11 having the −X direction as its gradually increasing direction may be arranged on the −X direction side of a prohibited block 4i.

In order to obtain the shaped beam B2, the rectangular beam B1 is irradiated over a part of the transmission hole 11 and a part of the prohibited block 4i which is adjacent to the block 4b in which this transmission hole 11 is provided. In this case, the transmission hole 11 has a right-angled triangular shape and the shaped beam B2 thus has a right-angled triangular cross section. Accordingly, it is sufficient to provide one prohibited block 4i with respect to one transmission hole 11. Furthermore, the shape of the transmission hole 11 is of course not limited to the right-angled triangular shape and the transmission hole 11 may have other shapes.

The charged particle beam exposure method according to the present invention may be realized by the charged particle beam exposure apparatus shown in FIG. 1 by using the transmission mask according to the present invention having the above defined transmission hole and prohibited block.

Figure 5A:
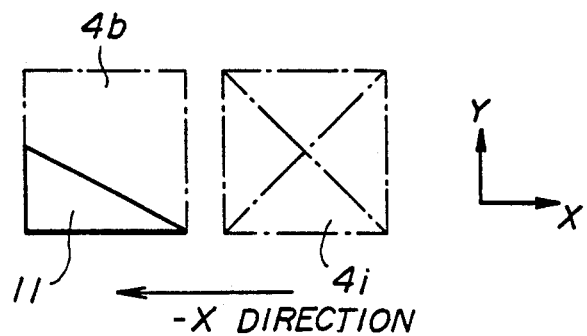
FIGS. 5A through 5C are plan views for explaining a first embodiment of a charged particle beam exposure method according to the present invention.
Figure 5B:
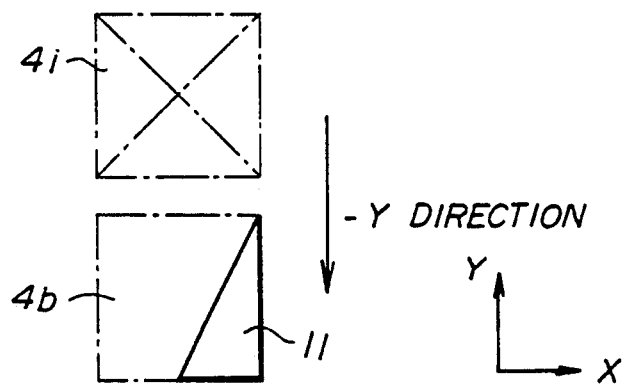
Figure 5C:
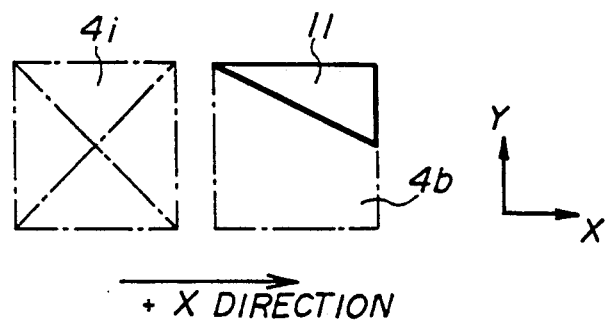

Next, a description will be given of a first embodiment of a charged particle beam exposure method according to the present invention which uses a first embodiment of a transmission mask according to the present invention, by referring to FIGS. 5A through 5C. In FIGS. 5A through 5C, those parts which are the same as those corresponding parts in FIG. 4 are designated by the same reference numerals, and a description thereof will be omitted.

In FIGS. 5A through 5C, the right-angled triangular shape of the transmission hole 11 in the block 4b is identical to that of the transmission hole shown in FIG. 4.

In FIG. 5A, a transmission hole 11 having the −X direction as its gradually increasing direction is arranged on the −X direction side of a prohibited block 4i. A transmission hole 11 having the −Y direction as its gradually increasing direction may be arranged on the −Y direction side of a prohibited block 4i as shown in FIG. 5B. A transmission hole 11 having the +X direction as its gradually increasing direction is arranged on the +X direction side of a prohibited block 4i as shown in FIG. 5C.

In order to obtain the shaped beam B2 in FIG. 1, the rectangular beam B1 is irradiated over a part of the transmission hole 11 and a part of the prohibited block 4i which is adjacent to the block 4b in which this transmission hole 11 is provided. In this case, the transmission hole 11 has a right-angled triangular shape and the shaped beam B2 thus has a right-angled triangular cross section. Accordingly, it is sufficient to provide one prohibited block 4i with respect to one transmission hole 11, and there is no need to provide a plurality of prohibited blocks with respect to one transmission hole.

Figure 6:
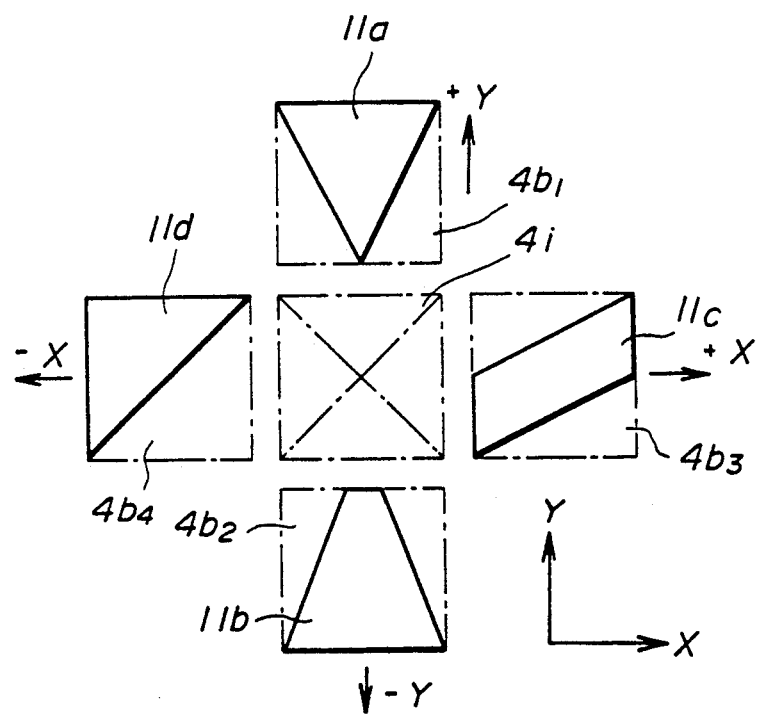
FIG. 6 is a plan view for explaining a second embodiment of the charged particle beam exposure method according to the present invention.

Next, a description will be given of a second embodiment of the charged particle beam exposure method according to the present invention which uses a second embodiment of the transmission mask according to the present invention, by referring to FIG. 6. In FIG. 6, those parts which are the same as those corresponding parts in FIG. 4 are designated by the same reference numerals, and a description thereof will be omitted.

In FIG. 6, four transmission holes 11a through 11d respectively are provided within blocks 4b1 through 4b4 which surround the prohibited block 4i. These transmission holes 11a through 11d have mutually different shapes. That is, the transmission hole 11a has a triangular shape, the transmission hole 11b has a trapezoidal shape, the transmission hole 11c has a parallelogrammic shape, and the transmission hole 11d has a right-angled triangular shape.

The transmission hole 11a having the +Y direction as its gradually increasing direction is arranged on the +Y direction side of the prohibited block 4i, and the transmission hole 11b having the −Y direction as its gradually increasing direction is arranged on the −Y direction side of the prohibited block 4i. Similarly, the transmission hole 11c having the +X direction as its gradually increasing direction is arranged on the +X direction side of the prohibited block 4i, and the transmission hole 11d having the −X direction as its gradually increasing direction is arranged on the −X direction side of the prohibited block 4i.

In order to obtain the shaped beam B2 in FIG. 1, the rectangular beam B1 is irradiated over a part of a selected one of the transmission holes 11a through 11d and a part of the prohibited block 4i which is adjacent to the block 4b in which the selected transmission hole is provided. Accordingly, it is sufficient to provide one prohibited block 4i with respect to the four transmission holes 11a through 11d. In other words, one prohibited block 4i is shared by the four transmission holes 11a through 11d, so as to minimize the area in which no transmission hole may be provided. In addition, it is possible to increase the number of kinds of patterns to be formed by the transmission mask in this embodiment.

Figure 7:
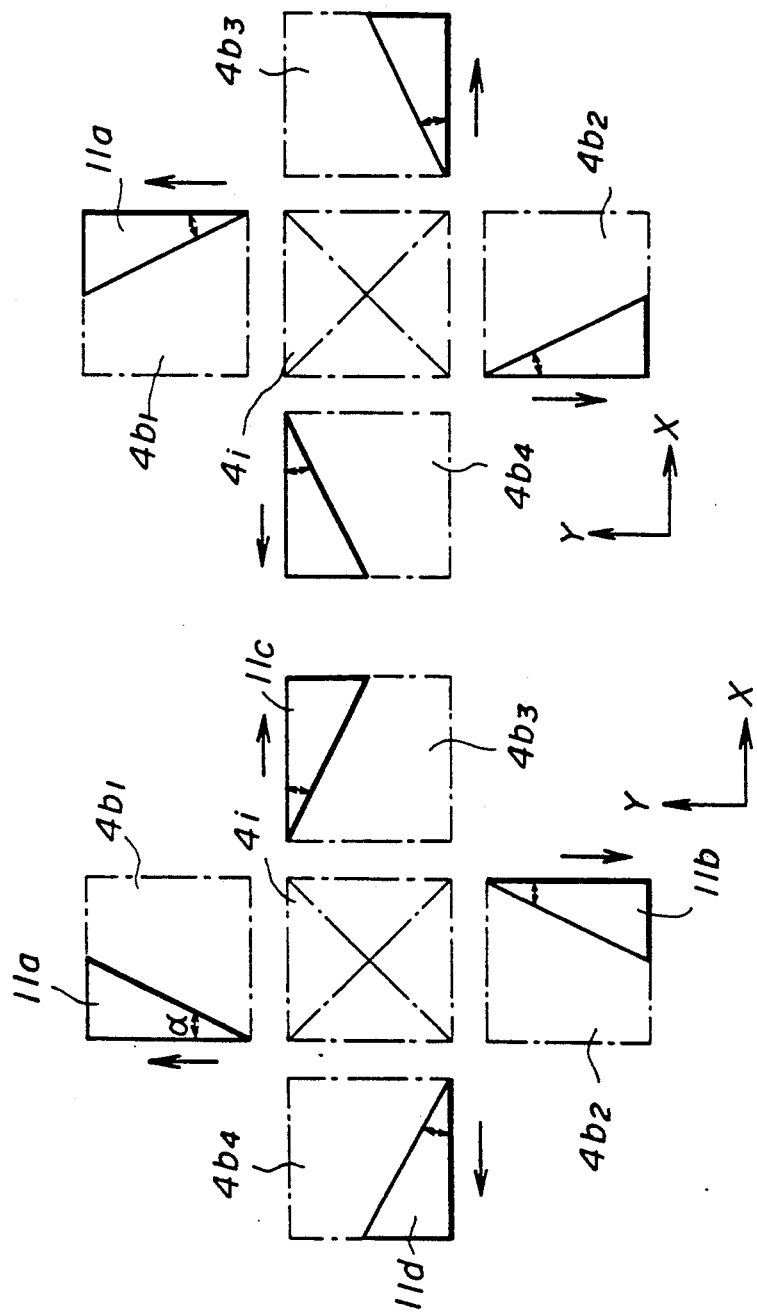
FIGS. 7A and 7B are plan views for explaining a third embodiment of the charged particle beam exposure method according to the present invention.

Next, a description will be given of a third embodiment of the charged particle beam exposure method according to the present invention which uses a third embodiment of the transmission mask according to the present invention, by referring to FIGS. 7A and 7B. In FIGS. 7A and 7B, those parts which are the same as those corresponding parts in FIG. 6 are designated by the same reference numerals, and a description thereof will be omitted.

In FIGS. 7A and 7B, four transmission holes 11a through 11d respectively are provided within blocks 4b1 through 4b4 which surround the prohibited block 4i. These transmission holes 11a through 11d have the same right-angled triangular shape but the arrangement of each right-angled triangular shape is rotated 90° relative to the adjacent transmission hole. Further, only the arrangement of the right-angled triangular shape is different between FIGS. 7A and 7B, and a description will thus only be given with respect to FIG. 7A for the sake of convenience.

In FIG. 7A, the transmission hole 11a having the +Y direction as its gradually increasing direction is arranged on the +Y direction side of the prohibited block 4i, and the transmission hole 11b having the −Y direction as its gradually increasing direction is arranged on the −Y direction side of the prohibited block 4i. Similarly, the transmission hole 11c having the +X direction as its gradually increasing direction is arranged on the +X direction side of the prohibited block 4i, and the transmission hole 11d having the −X direction as its gradually increasing direction is arranged on the −X direction side of the prohibited block 4i.

The shape of the transmission hole 11a is identical to that of the transmission hole 11d rotated 90° clockwise. The shape of the transmission hole 11b is identical to that of the transmission hole 11d rotated 180° clockwise. The shape of the transmission hole 11c is identical to that of the transmission hole 11d rotated 270° clockwise.

In order to obtain the shaped beam B2 in FIG. 1, the rectangular beam B1 is irradiated over a part of a selected one of the transmission holes 11a through 11d and a part of the prohibited block 4i which is adjacent to the block in which the selected transmission hole is provided. In this case, the transmission holes 11a through 11d have a right-angled triangular shape and the shaped beam B2 thus has a right-angled triangular cross section. Accordingly, it is sufficient to provide one prohibited block 4i with respect to the four transmission holes 11a through 11d. In other words, one prohibited block 4i is shared by the four transmission holes 11a through 11d, so as to minimize the area in which no transmission hole may be provided. In addition, this embodiment is suited when exposing basic patterns which are rotated because the IC often includes a repetition of basic patterns and rotated patterns thereof.

Figure 8:
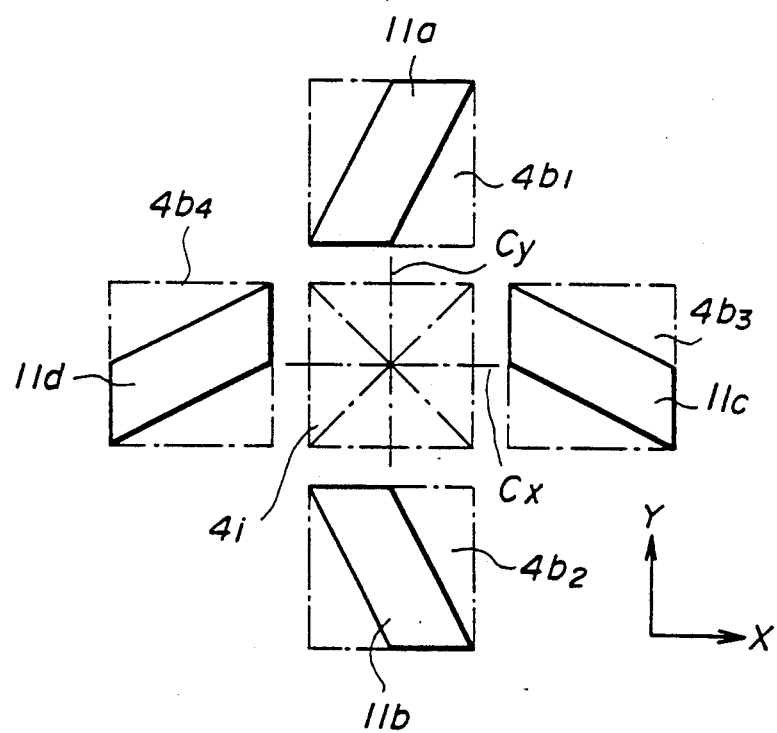
FIG. 8 is a plan view for explaining a fourth embodiment of the charged particle beam exposure method according to the present invention.

Next, a description will be given of a fourth embodiment of the charged particle beam exposure method according to the present invention which uses a fourth embodiment of the transmission mask according to the present invention, by referring to FIG. 8. In FIG. 8, those parts which are the same as those corresponding parts in FIG. 6 are designated by the same reference numerals, and a description thereof will be omitted.

In FIG. 8, four transmission holes 11a through 11d respectively are provided within blocks 4b1 through 4b4 which surround the prohibited block 4i. These transmission holes 11a through 11d have the same parallelogrammic shape but the arrangement of each parallelogrammic shape is such that the shapes of two mutually confronting transmission holes are symmetrical about the prohibited block 4i.

In FIG. 8, the transmission hole 11a having the +Y direction as its gradually increasing direction is arranged on the +Y direction side of the prohibited block 4i, and the transmission hole 11b having the −Y direction as its gradually increasing direction is arranged on the −Y direction side of the prohibited block 4i. Similarly, the transmission hole 11c having the +X direction as its gradually increasing direction is arranged on the +X direction side of the prohibited block 4i, and the transmission hole 11d having the −X direction as its gradually increasing direction is arranged on the −X direction side of the prohibited block 4i.

The shape of the transmission hole 11c is identical to that of the transmission hole 11a rotated 90° clockwise. The shape of the transmission hole 11d is identical to that of the transmission hole 11b rotated 90° clockwise. The shape of the transmission hole 11b is obtained by inverting the shape of the transmission hole 11a about an imaginary center line Cx of the prohibited block 4i. In addition, the shape of the transmission hole 11d is obtained by inverting the shape of the transmission hole 11c about an imaginary center line Cy of the prohibited block 4i.

In order to obtain the shaped beam B2 in FIG. 1, the rectangular beam B1 is irradiated over a part of a selected one of the transmission holes 11a through 11d and a part of the prohibited block 4i which is adjacent to the block in which the selected transmission hole is provided. Accordingly, it is sufficient to provide one prohibited block 4i with respect to the four transmission holes 11a through 11d. In other words, one prohibited block 4i is shared by the four transmission holes 11a through 11d, so as to minimize the area in which no transmission hole may be provided. In addition, this embodiment is suited when exposing basic patterns which are rotated and inverted because the IC often includes a repetition of basic patterns and rotated and/or inverted patterns thereof.

Figure 9:
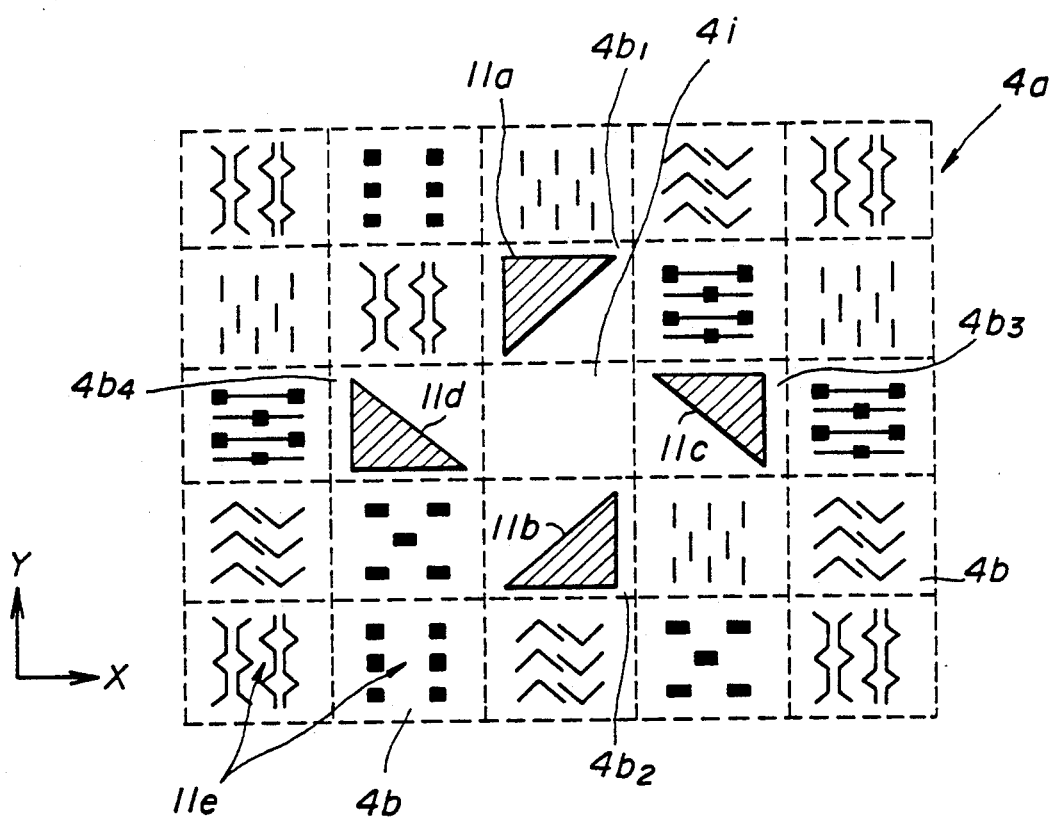
FIG. 9 is a plan view showing an essential part of a fifth embodiment of a transmission mask according to the present invention.

Next, a description will be given of a fifth embodiment of the transmission mask according to the present invention, by referring to FIG. 9. In FIG. 9, those parts which are the same as those corresponding parts in FIGS. 4 through 8 are designated by the same reference numerals, and a description thereof will be omitted.

In this embodiment, the transmission holes 11a through 11d are respectively provided within the blocks 4b1 through 4b4. The transmission holes 11a through 11d have the same triangular shapes, and the triangular shapes are arranged in the same manner as that shown in FIG. 7A. The prohibited block 4i is surrounded by the four blocks 4b1 through 4b4 in which the transmission holes 11a through 11d are provided. In blocks 4b other than the blocks 4b1 through 4b4, transmission holes 11e are provided. Each transmission hole 11e is of the type which is irradiated by the rectangular beam B1 in its entirety, that is, the rectangular beam B1 always passes through the entire transmission hole 11e and the size of the shaped beam B2 is not varied.

Next, a description will be given of a sixth embodiment of the transmission mask according to the present invention, by referring to FIG. 10. In FIG. 10, those parts which are the same as those corresponding parts in FIGS. 4 through 9 are designated by the same reference numerals, and a description thereof will be omitted.

In this embodiment, four transmission holes 11a through 11d are provided in the respective blocks 4b, and four alignment marks 11f are provided in the respective blocks 4b, in addition to the transmission holes 11e in the respective blocks 4b. Three sides of each block 4b in which the alignment mark 11f is provided is surrounded by the prohibited blocks 4i. One of the three prohibited blocks 4i surrounding the block 4b of the alignment mark 11f is used in common as the prohibited block 4i provided with respect to one of the transmission holes 11a through 11d. In addition, each alignment mark 11f can be used similarly as the transmission holes 11a through 11d by irradiating the square beam B1 over only a part of the alignment mark 11f.

For example, assuming that the square beam B1 irradiates the prohibited block 4i which is immediately adjacent to both the alignment mark 11f and the transmission hole 11a, the cross sectional area of the shaped beam B2 increases as the irradiating position of the square beam B1 is moved in the +Y direction. On the other hand, the cross sectional area of the shaped beam B2 increases as the irradiating position of the sequare beam B1 is moved in the +X direction. Hence, according to this embodiment, it is unnecessary to provide a prohibited block exclusively for each of the transmission holes 11a through 11d by effectively utilizing the prohibited blocks 4i which are already provided with respect to the alignment mark 11f.

In each of the embodiments, the cross sectional area of the square beam B1 is approximately equal to the area of one block 4b. The cross sectional area of the square beam B1 may be slightly smaller than that of the block 4b if the transmission hole 11 within each block 4b can be irradiated in its entirety by the square beam B1. On the other hand, the cross sectional area of the square beam B1 may be slightly greater than that of the block 4b if the transmission hole 11 within the adjacent block block 4b will not be irradiated by the square beam B1.

Further, the present invention is not limited to these embodiments, but various variations and modifications may be made without departing from the scope of the present invention.

What is claimed is:

1. A transmission mask adapted for use in exposing patterns by a charged particle beam which passes therethrough, said transmission mask comprising:
   a plate; and
   a plurality of rectangular blocks formed on a surface of said plate and having an area approximately equal to a cross sectional area of the charged particle beam irradiated thereon,
   said blocks including a first block in which at least one transmission hole is provided and a second block in which no transmission hole is provided, the transmission hole of said first block being partly irradiated by the charged particle beam when varying the size of the exposing pattern,
   a single second block being provided immediately adjacent to at least two first blocks, so that an irradiating position of the charged particle beam can be varied with respect to said two first blocks from said single second block.

2. The transmission mask as claimed in claim 1, wherein the transmission holes in said two first blocks have shapes arranged in directions such that an area of the transmission hole in the first block increases as the irradiating position of the charged particle beam moves from said single second block towards each of said two first blocks.

3. The transmission mask as claimed in claim 1, wherein the transmission holes in said two first blocks have the same shape.

4. The transmission mask as claimed in claim 3, wherein the transmission holes in said two first blocks are arranged such that the shape of one of the two transmission holes is rotated by an integer multiple of 90° relative to the other.

5. The transmission mask as claimed in claim 1, wherein the transmission holes in said two first blocks have mutually different shapes.

6. The transmission mask as claimed in claim 1, wherein four first blocks are provided immediately adjacent to said single second block.

7. The transmission mask as claimed in claim 6, wherein the transmission holes in all of said four first blocks have the same shape.

8. The transmission mask as claimed in claim 7, wherein the transmission holes in said four first blocks are arranged such that the shape of one of the four transmission holes is rotated by an integer multiple of 90° relative to another.

9. The transmission mask as claimed in claim 6, wherein the transmission holes in said fourth first blocks have mutually different shapes.

10. The transmission mask as claimed in claim 1, wherein one of the transmission holes in said two first blocks is an alignment mark.

11. The transmission mask as claimed in claim 1, wherein said blocks further include a third block including a transmission hole which is always irradiated in its entirety by the charged particle beam.

12. A charged particle beam exposure method which exposes patterns on an exposing surface using a transmission mask which includes a plurality of blocks including a first block in which at least one transmission hole is provided and a second block in which no transmission hole is provided, said charged particle beam exposure method comprising the steps of:
   (a) shaping a charged particle beam into a first beam having a rectangular cross section by a shaping means;
   (b) arranging the transmission mask between the shaping means and the exposing surface so that the rectangular cross section of the first beam irradiated on the transmission mask is approximately equal to an area of one block;
   (c) irradiating the first beam on the transmission mask with an overlap between two predetermined first and second blocks which are immediately adjacent to each other to partly irradiate a transmission hole of the predetermined first block by the first beam when varying the size of the exposing pattern, said predetermined second block being provided immediately adjacent to at least two first blocks including the predetermined first block, so that an irradiating position of the first beam can be varied with respect to both the two first blocks from the predetermined second block; and
   (d) irradiating the exposing surface by a second beam which is shaped when the first beam passes through the transmission mask.

13. The charged particle beam exposure method as claimed in claim 12, wherein said step (b) arranges a transmission mask in which the transmission holes in the two first blocks have shapes arranged in directions such that an area of the transmission hole in the first block increases as the irradiating position of the first beam moves from the predetermined second block towards each of the two first blocks.

14. The charged particle beam exposure method as claimed in claim 12, wherein said step (b) arranges a transmission mask in which the transmission holes in the two first blocks have the same shape.

15. The charged particle beam exposure method as claimed in claim 14, wherein said step (b) arranges a transmission mask in which the transmission holes in the two first blocks are arranged such that the shape of one of the two transmission holes is rotated by an integer multiple of 90° relative to the other.

16. The charged particle beam exposure method as claimed in claim 12, wherein said step (b) arranges a transmission mask in which the transmission holes in the two first blocks have mutually different shapes.

17. The charged particle beam exposure method as claimed in claim 12, wherein said step (b) arranges a transmission mask in which four first blocks are provided immediately adjacent to the predetermined second block.

18. The charged particle beam exposure method as claimed in claim 17, wherein said step (b) arranges a transmission mask in which the transmission holes in all of the four first blocks have the same shape.

19. The charged particle beam exposure method as claimed in claim 18, wherein said step (b) arranges a transmission mask in which the transmission holes in the four first blocks are arranged such that the shape of one of the four transmission holes is rotated by an integer multiple of 90° relative to another.

20. The charged particle beam exposure method as claimed in claim 17, wherein said step (b) arranges a transmission mask in which the transmission holes in the fourth first blocks have mutually different shapes.

21. The charged particle beam exposure method as claimed in claim 12, wherein said step (b) arranges a transmission mask in which one of the transmission holes in the two first blocks is an alignment mark.

22. The charged particle beam exposure method as claimed in claim 12, wherein said step (b) arranges a transmission mask in which the blocks further include a third block including a transmission hole which is always irradiated in its entirety by the first beam.

* * * * *